United States Patent [19]
Yieh et al.

[11] Patent Number: 6,121,164
[45] Date of Patent: *Sep. 19, 2000

[54] METHOD FOR FORMING LOW COMPRESSIVE STRESS FLUORINATED OZONE/TEOS OXIDE FILM

[75] Inventors: Ellie Yieh, Millbrae, Calif.; Xin Zhang, Plano, Tex.; Bang Nguyen, Fremont, Calif.; Stuardo Robles, Sunnyvale, Calif.; Peter Lee, Fremont, Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/957,058

[22] Filed: Oct. 24, 1997

[51] Int. Cl.$^7$ .......................... H01L 21/31; H01L 21/469
[52] U.S. Cl. .......................... 438/790; 438/624; 438/784; 438/783
[58] Field of Search ................................ 438/623, 624, 438/626, 760, 761, 762, 763, 778, 780–783, 784, 787–790, 958

[56] References Cited

U.S. PATENT DOCUMENTS

| | | | |
|---|---|---|---|
| 4,295,869 | 10/1981 | Shiraishi et al. | 65/3.11 |
| 4,300,989 | 11/1981 | Chang | 204/164 |
| 4,468,413 | 8/1984 | Bachmann | 427/39 |
| 4,592,933 | 6/1986 | Meyerson et al. | 427/255.1 |
| 4,708,884 | 11/1987 | Chandross et al. | 427/39 |
| 4,717,586 | 1/1988 | Ishihara et al. | 427/38 |
| 4,735,648 | 4/1988 | Marshall | 65/3.12 |
| 4,842,897 | 6/1989 | Takeuchi et al. | 427/255.2 |
| 4,894,352 | 1/1990 | Lane et al. | 437/238 |
| 4,968,339 | 11/1990 | Miller et al. | 65/3.12 |
| 5,013,691 | 5/1991 | Lory et al. | 437/238 |
| 5,069,701 | 12/1991 | Pastor et al. | 65/18.2 |
| 5,071,460 | 12/1991 | Fujiura et al. | 65/3.12 |
| 5,215,787 | 6/1993 | Homma | 427/248.1 |
| 5,288,518 | 2/1994 | Homma | 427/255.1 |
| 5,334,552 | 8/1994 | Homma | 438/624 |
| 5,354,715 | 10/1994 | Wang et al. | 437/238 |
| 5,399,529 | 3/1995 | Homma | 438/624 |
| 5,403,630 | 4/1995 | Matsui et al. | 427/583 |
| 5,405,805 | 4/1995 | Homma | 438/623 |
| 5,413,967 | 5/1995 | Matsuda et al. | 437/235 |
| 5,571,571 | 11/1996 | Musaka et al. | 427/574 |
| 5,571,576 | 11/1996 | Qian et al. | 427/574 |
| 5,661,093 | 8/1997 | Ravi et al. | 438/763 |
| 5,753,564 | 5/1998 | Fukada | 438/624 |
| 5,807,785 | 9/1998 | Ravi | 438/624 |
| 5,814,888 | 9/1998 | Nishioka et al. | 257/758 |
| 5,827,785 | 10/1998 | Bhan et al. | 438/784 |
| 5,908,672 | 6/1999 | Ryu et al. | 427/574 |

FOREIGN PATENT DOCUMENTS

| | | | |
|---|---|---|---|
| 406069196A | 3/1994 | Japan | H01L 21/316 |
| 92/20833 | 11/1992 | WIPO | C23C 16/00 |

OTHER PUBLICATIONS

Carl, D., et al. "The Effect of $O_2:C_2F_6$ Ratios and Low Frequency Power on the Gap Fill Properties and Stability of F–TEOS Films," *DUMIC Conference*, Feb. 21–22, 1995, pp. 234–240.

Laxman, Ravi K., "Low ε Dielectrics: CVD Fluorinated Silicon Dioxides," *Semiconductor International*, May 1995, pp. 71–72 and 74.

Yieh, E., et al., "TEOS/$O_3$ SACVD Processes," *Semiconductor Fabtech 94*, pp. 205–208.

*Primary Examiner*—Charles Bowers
*Assistant Examiner*—Thanh Nguyen
*Attorney, Agent, or Firm*—Townsend Townsend & Crew

[57] ABSTRACT

A method and apparatus for forming a halogen-doped silicon oxide film, preferably a fluorinated silicon glass (FSG) film, having compressive stress less than about $-5 \times 10^8$ dynes/cm$^2$. In a specific embodiment, the FSG film is formed by a sub-atmospheric CVD thermal process at a pressure of between about 60–650 torr. The relatively thin film, besides having a low dielectric constant and good gap fill capability, has low compressive stress, and is particularly suitable for use as an intermetal (IMD) layer.

13 Claims, 14 Drawing Sheets

METHOD FOR FORMING LOW COMPRESSIVE STRESS FLUORINATED OZONE/TEOS OXIDE FILM

BACKGROUND OF THE INVENTION

The present invention relates to semiconductor processing. More specifically, the present invention relates to a method and apparatus for forming a halogen-doped silicon oxide film having low compressive stress. The film of the present invention is particularly useful as an intermetal dielectric (IMD) layer in a multiple metal layer structure, but may also be employed as a premetal dielectric layer, passivation layer, or the like.

One of the primary steps in the fabrication of modern semiconductor devices is the formation of a film, such as a silicon oxide, on a semiconductor substrate. Silicon oxide is widely used as an insulating layer, such as an IMD layer, in the manufacture of semiconductor devices. A silicon oxide film can be deposited by thermal chemical vapor deposition (CVD) or plasma-enhanced chemical vapor deposition (PECVD) processes. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film. In general, reaction rates in thermal and plasma processes may be controlled by controlling one or more of the following: temperature, pressure, and reactant gas flow rate.

Semiconductor device geometries have dramatically decreased in size since such devices were first introduced several decades ago. Since then, integrated circuits have generally followed the two-year/half-size rule (often called "Moore's Law") which means that the number of devices which will fit on a chip doubles every two years. Wafer fabrication plants are routinely producing devices with 0.5 $\mu$m and even 0.35 $\mu$m size features. Fabrication plants soon will be producing devices having even smaller geometries. As device sizes become smaller and integration density increases, issues which were not previously considered important by the industry are becoming of concern.

In modern devices utilizing multilevel metal technology in which three, four, or more layers of metal are formed on the semiconductor substrate, the properties of insulating films used as IMD layers are increasingly important. In particular, insulating films for IMD applications need to have, for example, low dielectric constants, good gap fill capability, and low compressive intrinsic stress. Low dielectric constant films used as IMD layers are required in order to reduce the RC time delay of the interconnect metallization, to prevent cross-talk between the different levels of metallization, and to reduce device power consumption. In addition to having low dielectric constants, films used as IMD layers need good gap fill capability. That is, the layers should exhibit good step coverage and planarization properties to produce void-free layers that completely fill steps and openings in the underlying layers. As device sizes become smaller and integration density increases, it becomes critical to control the intrinsic stress level of films used as IMD layers. Such films need to have an overall low compressive stress, because intrinsic stress levels above or below certain levels may lead to wafer bowing, film cracking, void formation in the film, or other problems. Specifically, high tensile stress in the film causes the substrate to bend in a concave manner, while high compressive stress in the film causes the substrate to bend in a convex manner. It is optimal that IMD layers have a low compressive stress, avoiding concave or convex bending of the substrate, in order to avoid hillocking of metal during subsequent processing steps.

Conventional approaches to forming films suitable for use as IMD layers in some applications have proven limited in applications with more stringent requirements. For example, halogen-doped silicon glass films, such as fluorinated silicon glass (FSG) films, deposited by a plasma-enhanced process generally are compressively stressed, but step coverage or gap-filling capability for complex or smaller device geometries may be inhibited by the directionality of the plasma process. As another example, thermally-deposited ozone $(O_3)$/tetraethylorthosilicate (TEOS) films, such as borosilicate glass (BSG) films, phosphosilicate glass (PSG) films, and borophosphosilicate glass (BPSG) films, sometimes used as IMD layers have high tensile stresses (greater than about $1$–$2 \times 10^9$ dynes/cm$^2$) that may result in concave bending of the substrate.

In another conventional approach, an undoped silicon glass (USG) film formed from a thermal $O_3$/TEOS CVD process has a low dielectric constant suitable for IMD applications. Such films, referred to as $O_3$/TEOS USG films, also exhibit good gap-filling capability for devices having about 0.25 $\mu$m spacing or less and greater than about 2.5:1 aspect ratios. However, $O_3$/TEOS USG films have high tensile intrinsic stress (on the order of $3 \times 10^9$ dynes/cm$^2$). In order to cover deep gaps adequately, such $O_3$/TEOS USG films need to be thick, e.g., about 0.6 $\mu$m thick, in some applications. As a result, the thick $O_3$/TEOS USG film has high cumulative tensile stresses which have been counteracted by forming a compressively stressed capping layer using a PECVD process over the $O_3$/TEOS USG film. To counteract the high tensile stress of the thick $O_3$/TEOS USG layer, a relatively thick (e.g., greater about 1.5 $\mu$m thick) PECVD capping layer having a high compressive stress is required. Therefore, the composite insulating layer (made of the thick $O_3$/TEOS USG layer and the thick PECVD capping layer) has a large overall thickness (e.g., about 2.1 $\mu$m) for managing the overall stress of the composite insulating layer in IMD applications requiring filling of deep gaps.

Although it can provide film properties suitable for advanced IMD applications and manages the overall film stress, the use of a thick composite insulating layer made of an $O_3$/TEOS USG layer and PECVD capping layer has drawbacks such as resulting in both processing inefficiency and device performance issues. Specifically, deposition of such a thick insulating layer increases the overall time required for substrate processing and decreases wafer throughput. With modern devices having multiple IMD layers, the processing inefficiencies become exaggerated. Moreover, processing steps, such as forming deep vias through the thick composite insulating layer and adequately filling these deep vias with a desired filling material, which are performed after the deposition of the composite insulating layer further add to the overall substrate processing time. Filling the deep vias formed in the thick composite insulating layer may result in voids formed in the filling material which may affect device performance. Accordingly, it is desirable that the overall thickness of the insulating film having film properties suitable for use as an IMD layer in modern devices be minimized in order to increase wafer throughput by reducing the substrate processing time and to avoid problems associated with filling deep vias in the composite insulating layer.

The issues arising from the use of a thick composite insulating layer of an $O_3$/TEOS USG layer and PECVD capping layer as an IMD layer have not been satisfactorily resolved. For example, one approach used to reduce the overall thickness of the composite insulating layer is to perform an etch or a chemical mechanical polish (CMP) of the PECVD capping layer formed on the thick $O_3$/TEOS USG layer. However, a thick PECVD capping layer having high compressive stress needs to remain on the thick $O_3$/TEOS USG layer in order to manage the overall film stress and avoid film cracking. Another approach to reducing the overall thickness of the composite insulating layer is to use a thinner initial $O_3$/TEOS USG layer. However, use of a thinner $O_3$/TEOS USG layer can result in voids in the PECVD capping layer within wider gaps. Such voids are undesirable because they can lead to device problems.

In view of the above, an alternative approach is desired to produce a thin, low dielectric constant film, having good gap fill capability and low compressive intrinsic stress, that is suitable for complex or small device geometries in IMD applications and other applications.

SUMMARY OF THE INVENTION

The present invention solves the above problems of the prior art providing an improved method and apparatus for forming an insulating layer having a low dielectric constant, good gap-filling properties, and low compressive stress. The present invention achieves this by using a sub-atmospheric CVD (SACVD) thermal $O_3$/TEOS process to deposit a halogen-doped film in which deposition occurs at pressures below atmospheric pressure but above those used in LPCVD. Typical sub-atmospheric pressures range between 60–650 torr. Thermal deposition at such pressures can produce films which, besides having a low dielectric constant and good gap fill capability, exhibit low compressive stress. Such thermal films are particularly suitable for use as IMD layers.

In one embodiment, the present invention provides a process for depositing an insulating layer on a substrate in a chamber. The process includes the step of flowing a process gas comprising TEOS, ozone, and halogen atoms into the chamber to deposit a halogen-doped silicon oxide film on the substrate, where the film has a compressive stress of less than about $-5 \times 10^8$ dynes/cm$^2$. The process also includes the step of setting and maintaining pressure within the chamber at a pressure between about 60–650 torr during deposition of the halogen-doped silicon oxide film. In other specific embodiments, the halogen-doped silicon oxide film is a fluorinated silicon glass (FSG) film formed using triethoxyfluorosilane (TEFS). With the present invention, a halogen-doped silicon oxide film having properties suitable for use in modern IMD applications may be provided that also has a minimized film thickness in comparison with conventional thick composite films discussed earlier.

These and other embodiments of the present invention, as well as its advantages and features are described in more detail in conjunction with the text below and attached figures.

DETAILED DESCRIPTION OF THE SPECIFIC EMBODIMENTS

I. Exemplary CVD System

The layer according to the present invention can be formed in a variety of different substrate processing systems. One suitable substrate processing system in which the method of the present invention may be carried out is shown in FIG. 1(a).

Figure 1A:
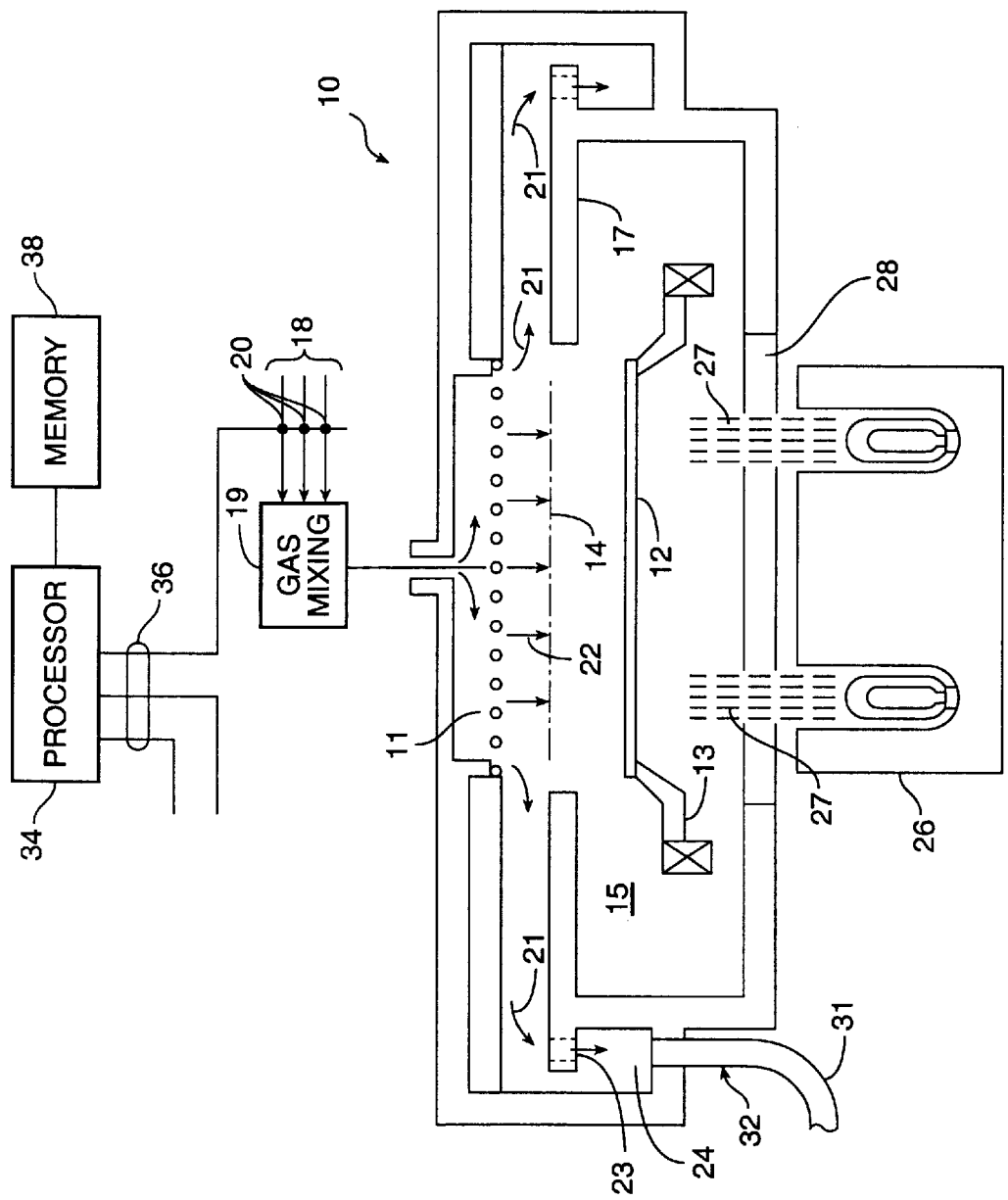
FIG. 1(a) is a vertical, cross-sectional view of one embodiment of a chemical vapor deposition apparatus according to the present invention.

FIG. 1(a) illustrates one embodiment of a lamp-heated sub-atmospheric chemical vapor deposition (SACVD) system 10 having a vacuum chamber 15 in which the halogen-doped silicon oxide layer according to the present invention can be deposited. CVD system 10 contains a gas distribution manifold 11 for dispersing process gases through perforated holes in manifold 11 to a wafer (not shown) that rests on a susceptor 12. Susceptor 12 is highly thermally responsive and is mounted on supports 13 so that susceptor 12 (and the wafer supported on the upper surface of susceptor 12) can be controllably moved between a lower loading/off-loading position and an upper processing position 14 which is closely adjacent to manifold 11. A center board (not shown) includes sensors for providing information on the position of the wafer.

When susceptor 12 and the wafer are in processing position 14, they are surrounded by a baffle plate 17 having a plurality of spaced holes 23 which exhaust into an annular vacuum manifold 24. Deposition and carrier gases are supplied through supply lines 18 into a mixing system 19 where they are combined and then sent to manifold 11. Generally, supply lines 18 for each of the process gases include (i) safety shut-off valves (not shown) that can be used to automatically or manually shut off the flow of process gas into the chamber, and (ii) mass flow controllers 20 that measure the flow of gas or liquid through the supply lines. When toxic gases are used in the process, the several safety shut-off valves are positioned on each gas supply line in conventional configurations. The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the wafer in a laminar flow as indicated by arrows 21. An exhaust system then exhausts the gas via ports 23 into the circular vacuum manifold 24 and out an exhaust line 31 by a vacuum pump system (not shown). The rate at which gases are released through exhaust line 31 is controlled by a throttle valve 32.

The deposition process performed in CVD system 10 is a thermal process with heat distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of the susceptor and provides rapid thermal and uniform susceptor and wafer heating for effecting deposition.

Typically, any or all of the chamber lining, gas distribution manifold faceplate, supports 13, and various other reactor hardware is made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Wang et al. and assigned to Applied Materials, Inc., the assignee of the present invention, which is incorporated herein by reference for all purposes.

A motor (not shown) raises and lowers susceptor 12 between a processing position 14 and a lower, wafer-loading position. Motors and optical sensors are used to move and determine the position of movable mechanical assemblies such as throttle valve 32 and susceptor 12. The heater, motors, valves or flow controllers 20 connected to supply lines 18, gas delivery system, throttle valve 32, and lamp magnet drivers are all controlled by a system controller 34 over control lines 36 of which only some are shown.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, susceptor position, and other parameters of a particular process. Of course, other computer programs such as one stored on another memory device including, for example, a floppy disk or other another appropriate drive, may also be used to operate processor 34.

In a preferred embodiment, the system controller includes a hard disk drive (memory 38), a floppy disk drive and a card rack. The card rack contains a single board computer (SBC) processor, analog and digital input/output boards, interface boards and stepper motor controller boards. Various parts of CVD system 10 conform to the Versa Modular European (VME) standard which defines board, card cage, and connector dimensions and types. The VME standard also defines the bus structure having a 16-bit data bus and 24-bit address bus.

Figure 1B:
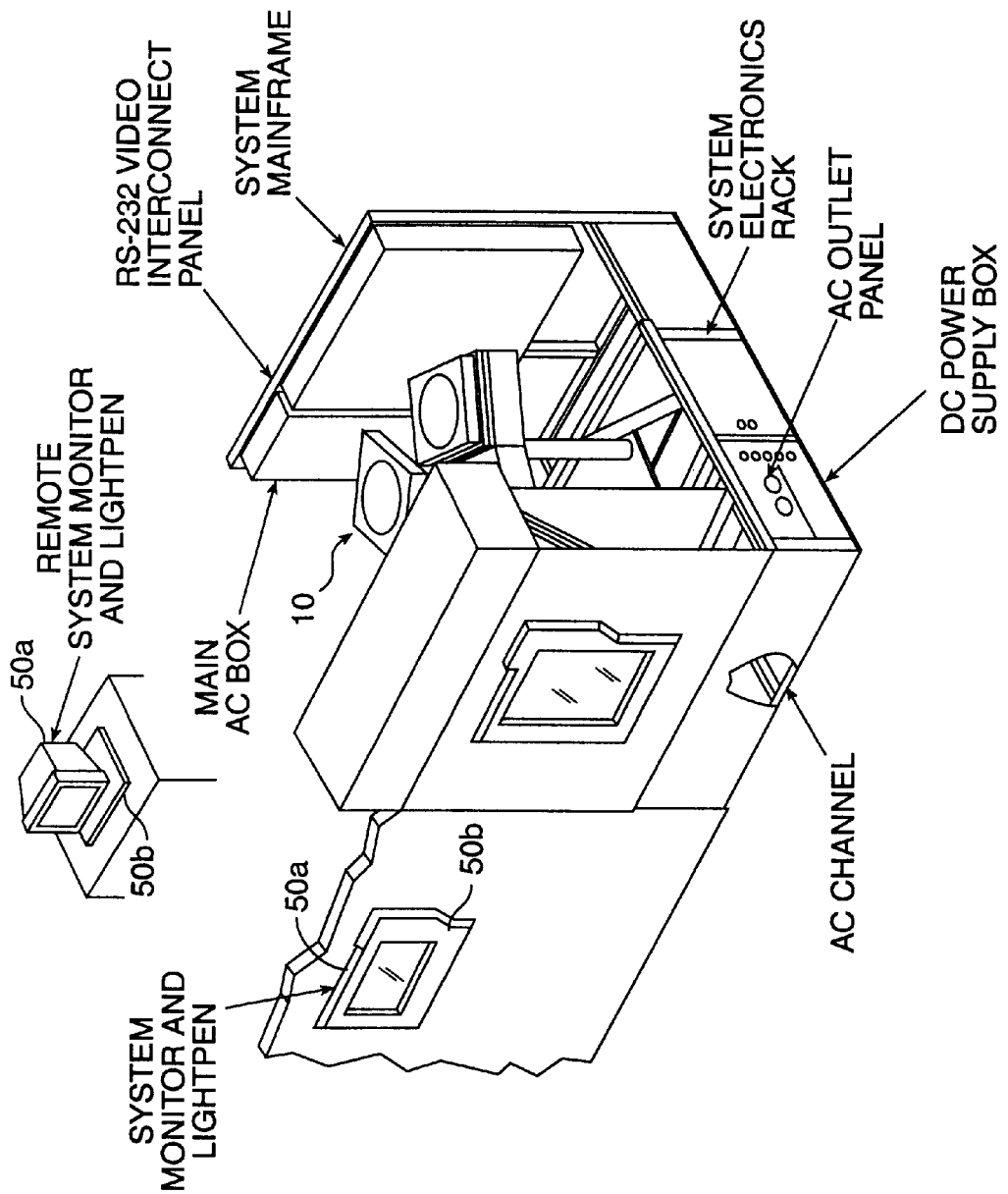
FIG. 1(b) is a simplified diagram of system monitor and CVD system 10 in a multi-chamber system, which may include one or more chambers.

The interface between a user and processor 34 is via a CRT monitor 50a and light pen 50b, shown in FIG. 1(b) which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. Both monitors 50a simultaneously display the same information, but only one light pen 50b is enabled. The light pen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the light pen and the display screen. Of course, other devices, such as a keyboard, mouse, or other pointing or communication device, may be used instead of or in addition to light pen 50b to allow the user to communicate with processor 34.

The process for depositing the film can be implemented using a computer program product that is executed by processor 34. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to perform the tasks identified in the program.

Figure 1C:
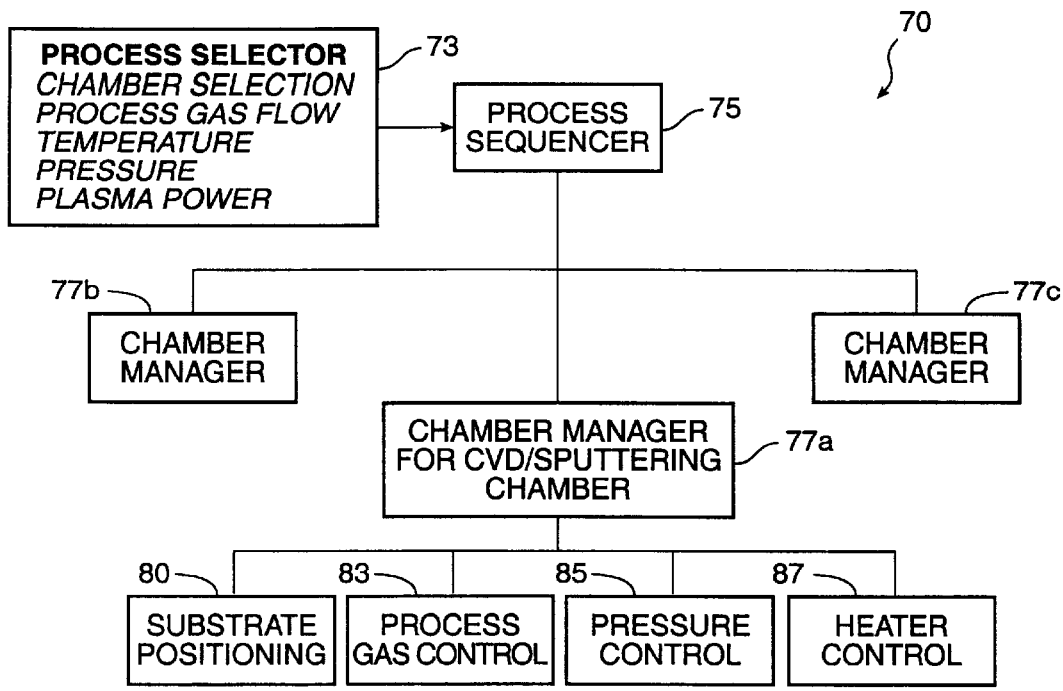
FIG. 1(c) shows an illustrative block diagram of the hierarchical control structure of the system control software, computer program 70, according to a specific embodiment.

FIG. 1(c) shows an illustrative block diagram of the hierarchical control structure of the system control software, computer program 70, according to a specific embodiment. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, cooling gas pressure, and chamber wall temperature and are provided to the user in the form of a recipe. The parameters specified by the process recipe are entered utilizing the light pen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, and heater control subroutine 87. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 1(c). The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, such as TEOS or TEFS, the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve 32 in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure, for example, ranging from less than 1 torr to 760 torr.

The heater control subroutine 87 comprises program code for controlling the temperature of the lamp module that is used to heat the substrate. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, compares the measured temperature to the setpoint temperature, and increases or decreases current applied to the lamp module 26 to obtain the setpoint temperature. The temperature is obtained from the measured voltage by looking up the corresponding temperature in a stored conversion table, or by calculating the temperature using a fourth order polynomial. When radiant lamps are used to heat the susceptor 12, the heater control subroutine 87 gradually controls a ramp up/down of current applied to the lamp. The gradual ramp up/down increases the life and reliability of the lamp. Additionally, a built-in fail-safe mode can be included to detect process safety compliance, and can shut down operation of the lamp module 26 if the process chamber 15 is not properly set up.

The above CVD system description is mainly for illustrative purposes and should not necessarily be considered as limiting the scope of the present invention. Additionally, other substrate processing equipment may be employed or variations in the above described system such as variations in susceptor design, heater design, and others are possible. For example, the wafer could be supported and heated by a resistively-heated platen. The dielectric layer and method for forming such a layer of the present invention is not necessarily limited to any specific apparatus.

II. Exemplary Structure

Figure 2:
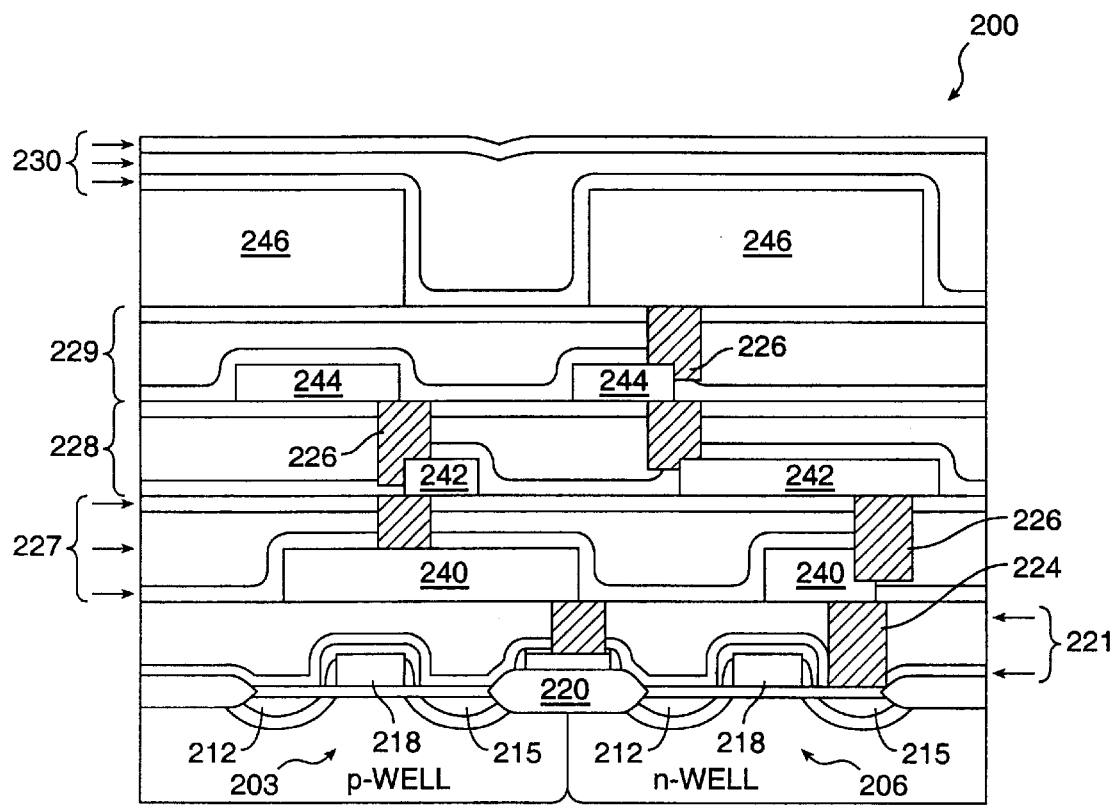
FIG. 2 is a simplified cross-sectional view of a semiconductor device manufactured according to the method of the present invention.

FIG. 2 illustrates a simplified cross-sectional view of an integrated circuit 200 according to the present invention. As shown, integrated circuit 200 includes NMOS and PMOS transistors 203 and 206. Each transistor 203 and 206 comprises a source region 212, a drain region 215 and a gate region 218. The transistors are separated and electrically isolated from each other by a field oxide region 220.

A premetal dielectric layer 221 separates transistors 203 and 206 from metal layer 240 with connections between metal layer 240 and the transistors made by contacts 224. Metal layer 240 is one of four metal layers (240, 242, 244, and 246) included in integrated circuit 200. Each metal layer is separated from adjacent metal layers by respective intermetal dielectric layers 227, 228, and 229. Adjacent metal layers are connected at selected openings by vias 226. Deposited over metal layer 246 are planarized passivation layers 230.

While the dielectric layer of the present invention may find uses in each of the dielectric layers shown in integrated circuit 200, physical properties of the film such as its low dielectric constant and good gap-fill properties make it most useful as an insulation layer between adjacent metal layers, as shown by IMD layers 227, 228, and 229. Typically, such IMD layers are between 0.2 and 0.6 μm thick. As seen in FIG. 2, in further processing steps, vias 226 that are formed in the IMD layers also need to be filled adequately. As mentioned above, such IMD layers are often formed of a thick composite insulating layer, such as a thick USG film capped with a PECVD film, in order to manage stress. With such thick composite films used as IMD layers, problems of filling deep vias in the composite insulating layer may be encountered in some applications.

In the present invention, a halogen-doped silicon oxide film, preferably an FSG film, may be formed by a thermal SACVD process and related apparatus. The thickness of the halogen-doped silicon oxide film used for an IMD layer depends on the height of the structures forming the gap to be filled. In typical applications, the deposited halogen-doped silicon oxide film thickness will be sufficient, about 60% of the height of the structures, to fill the gaps. As mentioned above, it is desirable for films used as IMD layers to have an overall low compressive stress. In contrast to thick $O_3$/TEOS USG films that have high tensile stress levels and require thick PECVD capping films to manage the overall intrinsic film stress, halogen-doped silicon oxide films have low compressive intrinsic stress and do not require such thick PECVD capping films to manage overall film stress and prevent film cracking. Instead, a much thinner PECVD capping layer (e.g., 1000 Å thick in some embodiments) may be used in order to produce an IMD layer (made of the FSG film and the thin PECVD capping layer) which has an overall low compressive stress. Of course, a thin PECVD capping layer may be deposited and remain on the FSG film to provide the thin composite film with low compressive stress, or a thick PECVD capping layer may be deposited on the FSG film and subjected to a CMP step to provide the thin composite film with low compressive stress. Because the capped FSG layer of the present invention is relatively thin compared to a thick capped $O_3$/TEOS USG layer, problems of filling deep vias in the composite insulating layer are also minimized.

It should be understood that the simplified integrated circuit 200 is for illustrative purposes only. One of ordinary skill in the art could implement the present method for fabrication of other integrated circuits such as microprocessors, application-specific integrated circuits (ASICs), memory devices, and the like.

III. Exemplary FSG Film Deposition Using SACVD

An exemplary process for depositing a film of halogen-doped silicon oxide film, such as FSG, which is suitable for use as an IMD layer having low compressive stress and relatively thin film thickness, is discussed below. The SACVD thermal process provides an FSG film having good gap-fill properties and low tensile stress at low temperatures and high deposition rates, according to preferred embodiments of the present invention.

The exemplary process deposits a film of FSG using triethoxyfluorosilane (TEFS) as a source of fluorine at a sub-atmospheric pressure. First, processor 34 controls the motor to load the substrate being processed onto susceptor 12 in vacuum chamber 15 through a vacuum-lock door and to move the substrate into processing position 14. In processing position 14, the susceptor and substrate generally are positioned about 200–600 mil from the gas distribution manifold and are preferably positioned about 250 mil from the manifold.

Once the substrate is properly positioned, processor 34 sets and maintains the pressure of the reaction chamber within a range of about 60–650 torr. Preferably, the pressure is maintained within the range of about 200–500 torr, and most preferably it is maintained at about 450 torr. Processor 34 also controls heater 26 to heat the substrate and susceptor to a temperature of between about 200–500° C. Preferably, the substrate and susceptor are heated to a temperature within the range of between about 350–450° C. and most preferably to about 400° C. This temperature range is maintained throughout the deposition.

A process gas is then introduced into the chamber from manifold 11. The process gas includes reactant gases containing fluorine, silicon, and oxygen. In a preferred embodiment, the reactant gases include TEFS as the fluorine source, TEOS as the silicon source, and one or more gaseous sources of oxygen like ozone ($O_3$). Being liquids, the TEFS and TEOS sources are vaporized by conventional boiler-type or bubbler-type hot boxes or by a liquid injection system. A liquid injection system provides good control of the volume of reactant liquid introduced into the gas mixing system. The vaporized gases are then mixed in the gas mixing system with a carrier gas, such as nitrogen, argon or helium, before being delivered to the gas distribution manifold. Of course, it is recognized that other sources of fluorine, silicon, and oxygen also may be used.

The rate at which the individual sources are introduced into gas mixing system 19 is controlled by processor 34 through appropriate gas supply lines and valves of the source distribution system. The TEOS and TEFS are vaporized and mixed with a helium carrier gas in, for example, a liquid injection system. The flow rate of vaporized TEOS/helium may range from about 1000–6000 standard cubic centimeters per minute (sccm), preferably ranging from about 3000–6000 sccm. The flow rate of vaporized TEFS/helium may range from about 500–6000 sccm, preferably ranging from about 2400–6000 sccm. Oxygen in the form of $O_3$ is introduced at a flow rate of between about 2000–5000 sccm and is preferably introduced at a flow rate of about 5000 sccm. The ozone mixture contains between about 5–14 wt % oxygen, preferably about 12 wt %. The ratio of $O_3$ to TEOS may range from about 0.1–1000:1, but is preferably between about 0.3–30:1. Typically the ratio will be about 10:1.

It is understood that the process is not limited to the use of the above-described materials. Among other fluorine sources which may be used are compounds containing fluorine and silicon, and preferably fluorine-silicon bonds, for example, fluorinated alkyl or alkoxy silane, or a fluorinated and alkylated or alkoxylated compound containing Si—Si bonds, such as a di-silane or higher silane, or other fluorinated silane or higher silane derivative. Compounds which may be used include those of the general formula: $Si_nX_oR_p$, where X is a halogen, preferably fluorine, but not necessarily all the same, R is alkyl or alkoxy, e.g., ethyl or ethoxy, not necessarily all the same, and $o+p=2n+2$, and o is at least 1. This general formula includes fluorinated alkyl or alkoxy di-silanes of the formula $SiF_xR_y$—$SiF_oR'_p$ where R, R' are alkyl or alkoxy, not necessarily all the same, and $x+y=o+p=3$, and $x+o$ is at least 1. An example of such a compound is FASI-4, where $x=o=2$, and R,R' are each ethyl. Likewise within this general formula are fluoro-alkoxy-silanes of the formula $SiF_x(OR)_y$ where R is an alkyl group, and $x+y=4$ with x being at least 1. An example is TEFS, where each R is ethyl, and $x=1,y=3$. Also within the above formula are fluoro-alkyl-silanes of the formula $SiF_xR_y$ where R is an alkyl group, and $x+y=4$, for example FASI-2, where each R is ethyl, and $x=y=2$. This also includes tetrafluorosilane, where $x=4$ and $y=0$. As another example, where the fluorine source contains the correct proportion of silicon and fluorine to react with ozone to produce a desired film composition, a separate silicon source (e.g., TEOS) may not be required.

IV. Exemplary USG Film Deposition

After forming the halogen-doped silicon oxide film such as FSG having low stress, a USG capping layer may be deposited (for example, in a PECVD chamber in the multichamber system of FIG. 1(*b*)) on the FSG film to provide a hydrophobic surface on top of the FSG layer to prevent moisture present in the ambient from being absorbed into the FSG film. Furthermore, the USG capping layer is a relatively dense film that advantageously impedes fluorine evolution.

Deposition of the USG cap layer by a plasma-enhanced TEOS (PETEOS) process is described in co-pending U.S. patent application Ser. No. 08/548,391, filed Oct. 26, 1996, entitled "METHOD AND APPARATUS FOR IMPROVING FILM STABILITY OF HALOGEN-DOPED SILICON OXIDE FILMS," the disclosure of which is incorporated by reference.

The USG layer can be deposited in a separate processing chamber from the FSG layer, but preferably is done as an in-situ process. The wafer and susceptor are heated to a temperature within the range of about 100–500° C., but preferably from about 360–440° C., and then maintained at this temperature throughout the deposition. The susceptor is positioned about 200–400 mil away from the gas distribution manifold and preferably about 230 mil away.

A gaseous mixture comprising oxygen and silicon sources is introduced into the deposition chamber. In a preferred embodiment, the silicon source is TEOS and the oxygen source is $O_2$, but those skilled in the art will recognize the additional silicon sources such as silane ($SiH_4$), TMCT or similar sources, and other oxygen sources such as ozone, $H_2O_2$ and mixtures of the same also can be employed. When TEOS is used as a silicon source, a carrier gas such as helium, argon or nitrogen is employed. The ratio of $O_2$ to TEOS may range from about 0.1–1000:1, but is preferably between about 0.3–30:1. Typically the ratio will be about 10:1.

The optimal total flow of the gaseous reactants will vary according to the geometry and design of the deposition chamber. The gas flow also can be varied to control the deposition rate. Typically, TEOS is introduced to the liquid delivery system at a flow rate of between about 10 and 1000 milligrams per minute (mgm), preferably at a flow rate of between about 500 and 1500 mgm, for mixing with a carrier gas. Helium is a typical carrier gas that is introduced at a flow rate of between 100–100000 sccm and preferably between about 1000–10000 sccm. $O_2$ is introduced at a flow rate of between about 10 and 10000 sccm and is preferably introduced at a flow rate of between about 500 and 1500 sccm. Usually, the total flow of gases into the deposition chamber will vary from about 1000 to about 10000 sccm.

Chamber pressure is maintained at a pressure of between 0.5 and 20 torr, and is preferably at a pressure of between 3 and 10 torr. Such a low pressure provides increased deposition rate and film uniformity. A plasma is formed using a frequency of 10.56 MHz at between 0–900 Watts, and preferably at about 350 Watts, and a lower frequency of between about 10 kHz to 2 MHz, preferably about 350 kHz at between about 0–500 Watts and preferably at about 100 Watts.

Under the above conditions, deposition rates of between 5000 and 10000 Å/minute are attainable. At such deposition rates, a USG cap layer of 1000 Å can be deposited in approximately 5–20 seconds. Typical application will have USG cap layers of between 100 and 2000 Å, and preferably between 500 and 1000 Å. A person of ordinary skill in the art, however, will realize that different capping layers of different thickness can be employed depending on the specific application and device geometry size.

V. Experimental Results

Experiments were conducted to demonstrate the effectiveness of using an FSG film (thin in comparison with a thermal $O_3$/TEOS USG film used in a conventional process) with low compressive stress capped with a PECVD USG capping layer to form a conformal, thin composite insulating layer suitable for use as an IMD layer in certain applications. All the experiments were performed in a lamp-heated Precision 5000 DCVD chamber (outfitted for 200-mm wafers) manufactured by Applied Materials, Inc. A $C_2F_6$—$NF_3$ two-step plasma clean was used after every deposition. The primary process recipe used in the experiments was as follows. For the discussion below, it is noted that flow rates of TEFS and TEOS are flow rates of vaporized TEFS with helium carrier gas and TEOS with helium carrier gas, respectively.

The FSG films were deposited at a temperature of 400° C. and at a pressure of 450 torr. Spacing between the susceptor and manifold was 230 mil. The flow rate of TEFS was 2400 sccm, and the flow rate of TEOS was 5000 sccm. Oxygen in the form of $O_3$ is introduced at a flow rate of 5000 sccm. The ozone mixture contained greater than 13 wt % oxygen. The FSG films deposited were 1 μm thick. Thirteen other processes were used by varying the deposition pressure, susceptor temperature and gas flow while keeping the other parameters the same as that in the above primary recipe.

FSG films deposited using these fourteen processes were evaluated by measuring the thickness, uniformity, stress and F concentration. Film thickness and uniformity were measured with a Prometrix™ SM300 film gauge (using 49 points, with 3-mm edge exclusion, 1 standard deviation). Film stress was measured with a Flexus™ 2300 stress gauge. Fluorine concentration was obtained by Fourier transform infrared (FTIR) spectroscopy.

The deposition rate of each process was calculated from the FSG film thickness after 2 minutes of deposition. FSG films with thickness of 1 μm capped with a 1000 Å PETEOS film were deposited to examine stress, FTIR and wet etch rate ratio. Because the water absorption of FSG film was expected to be very high, the 1000 Å thick PETEOS film was used as a cap layer, in this embodiment. The PETEOS film is a USG capping layer that is stable and does not readily absorb moisture. Thus, the USG capping layer provides a hydrophobic surface on top of the FSG layer that prevents moisture present in the ambient from being absorbed into the FSG film. Furthermore, the USG capping layer is a relatively dense film that impedes fluorine evolution.

In the experiments, the USG capping films were deposited onto the FSG films at a temperature of 400° C., a high RF power of 700 Watts, and at a pressure of 8.2 torr. Spacing between the susceptor and manifold was 230 mil. The flow rate of TEOS was 800 sccm. Oxygen in the form of $O_2$ is introduced at a flow rate of 600 sccm. The oxygen mixture contained greater than 13 wt % oxygen. The USG films deposited were 1000 Å thick.

Figure 3A:
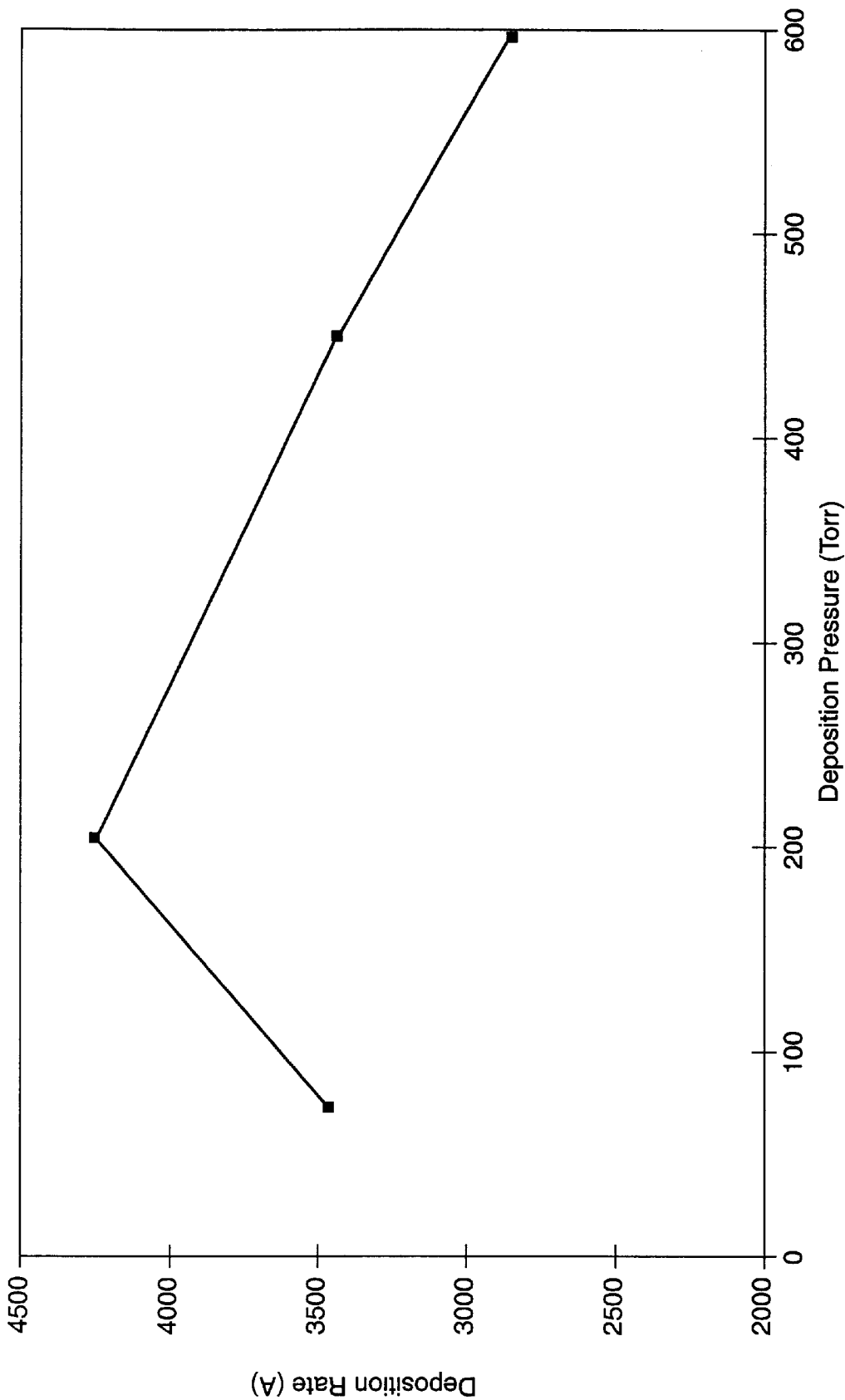
FIG. 3(a) is a graph showing the effect of deposition pressure on the deposition rate of FSG films.
Figure 3B:
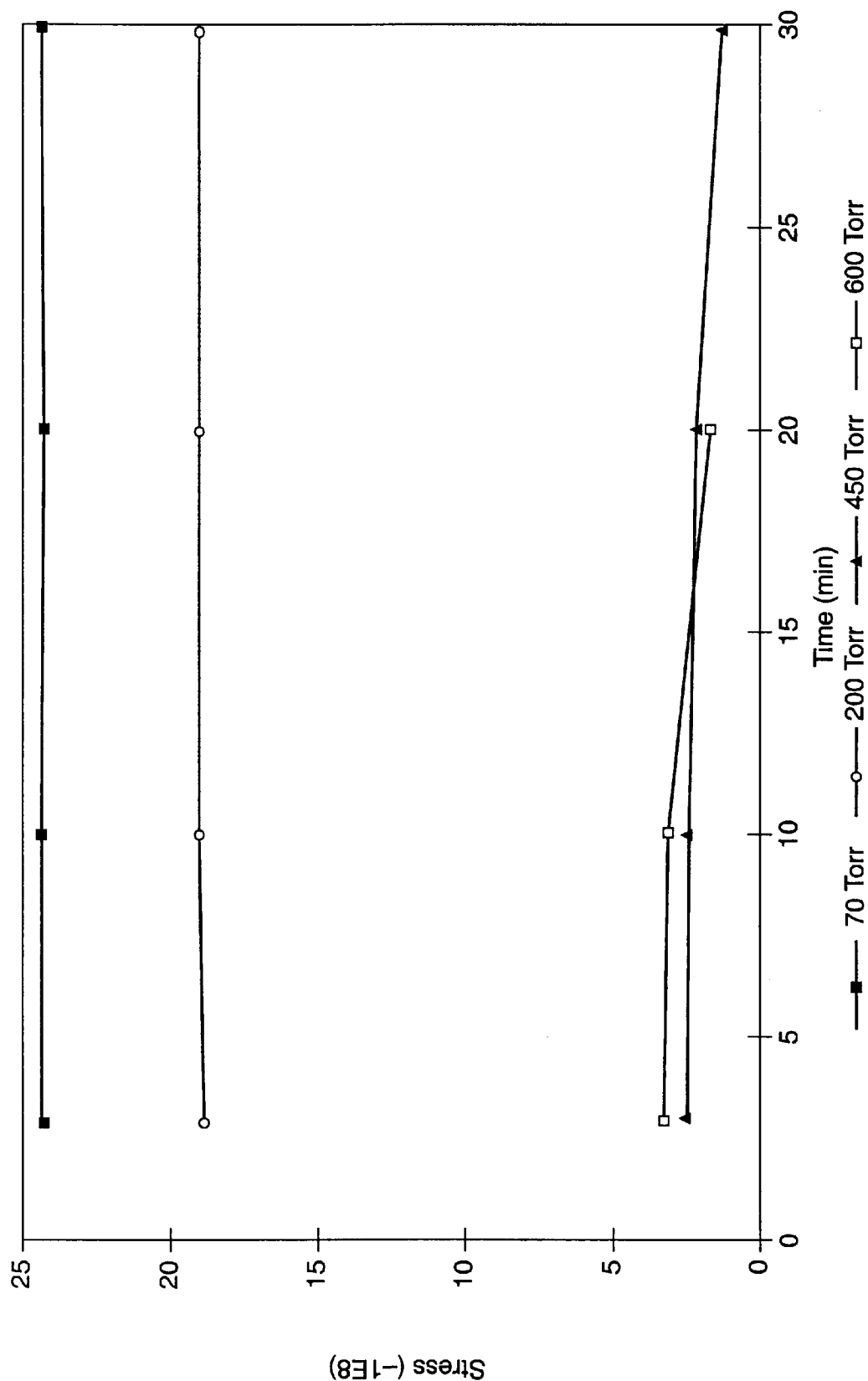
FIG. 3(b) is a graph showing how stress-time curves vary with deposition pressure.
Figure 3C:
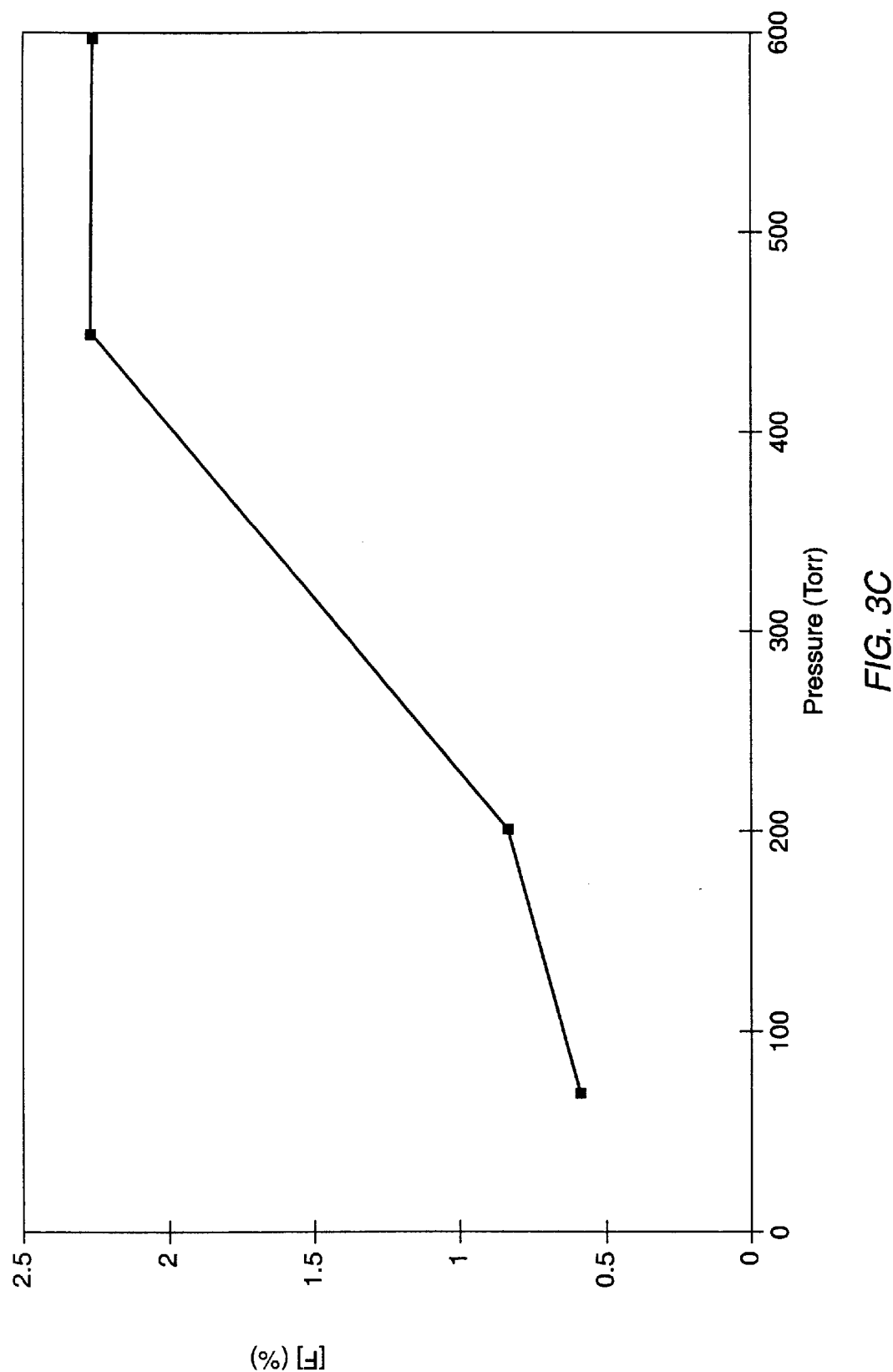
FIG. 3(c) is a graph showing how F concentration varies with deposition pressure.

FIGS. 3(a)–3(c) are graphs illustrating the effect on the FSG film by varying deposition pressure. The effect of varying the deposition pressure on the FSG film was studied by depositing FSG films using the primary recipe having pressure of 450 torr, and FSG films using the primary recipe but at varying pressures of 70, 200, and 600 torr. The relation between deposition rate and deposition pressure is shown in FIG. 3(a). The deposition rate had the highest value (4256 Å/min) at a pressure of 200 torr, and dropped at higher and lower pressures (e.g., about 3500 Å/min at 450 torr). Each capped FSG film was found to have low compressive stress. Stress as a function of time was measured to test the stability of the films. The capped FSG films were demonstrated to be stable films, as shown in FIG. 3(b) which illustrates that stress did not vary significantly over time for films that were deposited at lower pressures (about $-2.4 \times 10^9$ dynes/cm$^2$ at 70 torr, about $-1.9 \times 10^9$ dynes/cm$^2$ at 200 torr, about $-2.5 \times 10^8$ dynes/cm$^2$ at 450 torr). The F concentration was obtained from the FTIR spectrum by integrating the area under Si—F and Si—O peak. It was found that the F concentration, as shown in FIG. 3(c), increased as the deposition pressure increased for pressures lower than 450 torr. F concentration remained fairly constant at about 2.25 wt % for the capped FSG films deposited at pressures of 450 and 600 torr. The above experiments demonstrate that 1 μm thick FSG films exhibiting low compressive stress may be useful as IMD layers and may be formed at good deposition rates. The present FSG films with film properties suitable for IMD applications and having film thickness of about 1 μm advantageously have a minimized thickness compared to composite thermal $O_3$/TEOS capped USG films.

Next, the effect of varying the deposition temperature was investigated. Films were deposited with the primary recipe having susceptor temperature of 400° C., and with the primary recipe at different susceptor temperatures of 350° C. and 450° C. The deposition rates obtained for films deposited at these temperatures are listed in Table 1.

TABLE 1

| Temperature (° C.) | Deposition Rate (Å/min) |
|---|---|
| 350 | 2377 |
| 400 | 3453 |
| 450 | 2540 |

As seen in Table 1, the deposition rate was highest for the FSG film deposited at a temperature of 400° C., with lower deposition rates for films deposited at 350° C. and at 450° C. The F concentration of the FSG films having the higher deposition rates was measured to be about 2.26 wt % for the film deposited at 400° C. and about 1.67 wt % for the film deposited at 450° C. Thus, temperatures of approximately 400° C. appear to be the optimum temperature, to achieve a high deposition rate with higher F incorporation into the film. The deposition rate is desirably at least about 2300 Å/min, and preferably at least about 3000 Å/min. Advantageously it is at least about 3400 Å/min, and more preferably at least about 4000 Å/min. In a preferred embodiment, it is at least about 4500 Å/min. As shown below, the invention can provide such high deposition rates combined with good film properties.

Figure 4A:
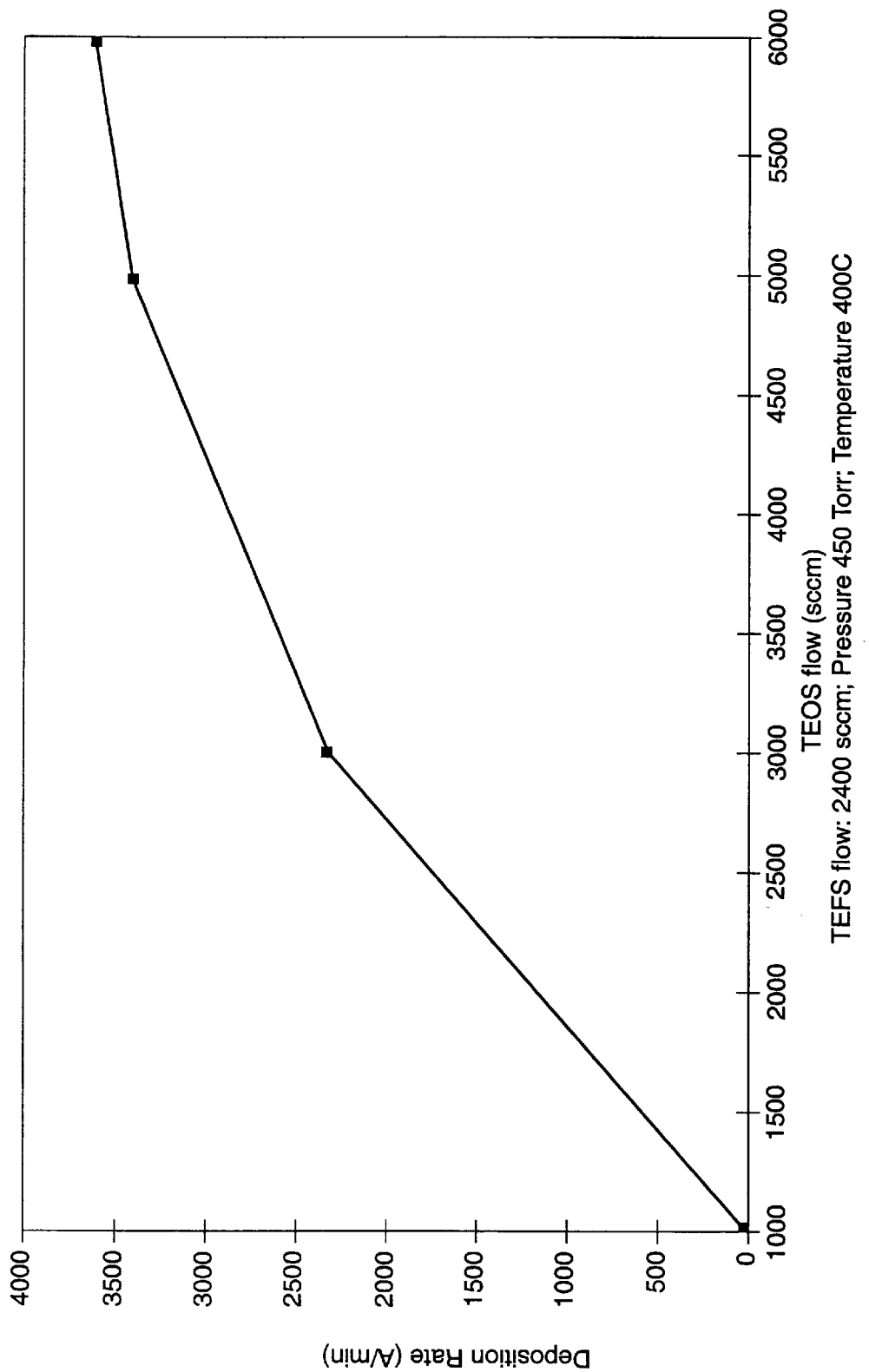
FIG. 4(a) is a graph showing the relation between deposition rate and TEOS rate.
Figure 4B:
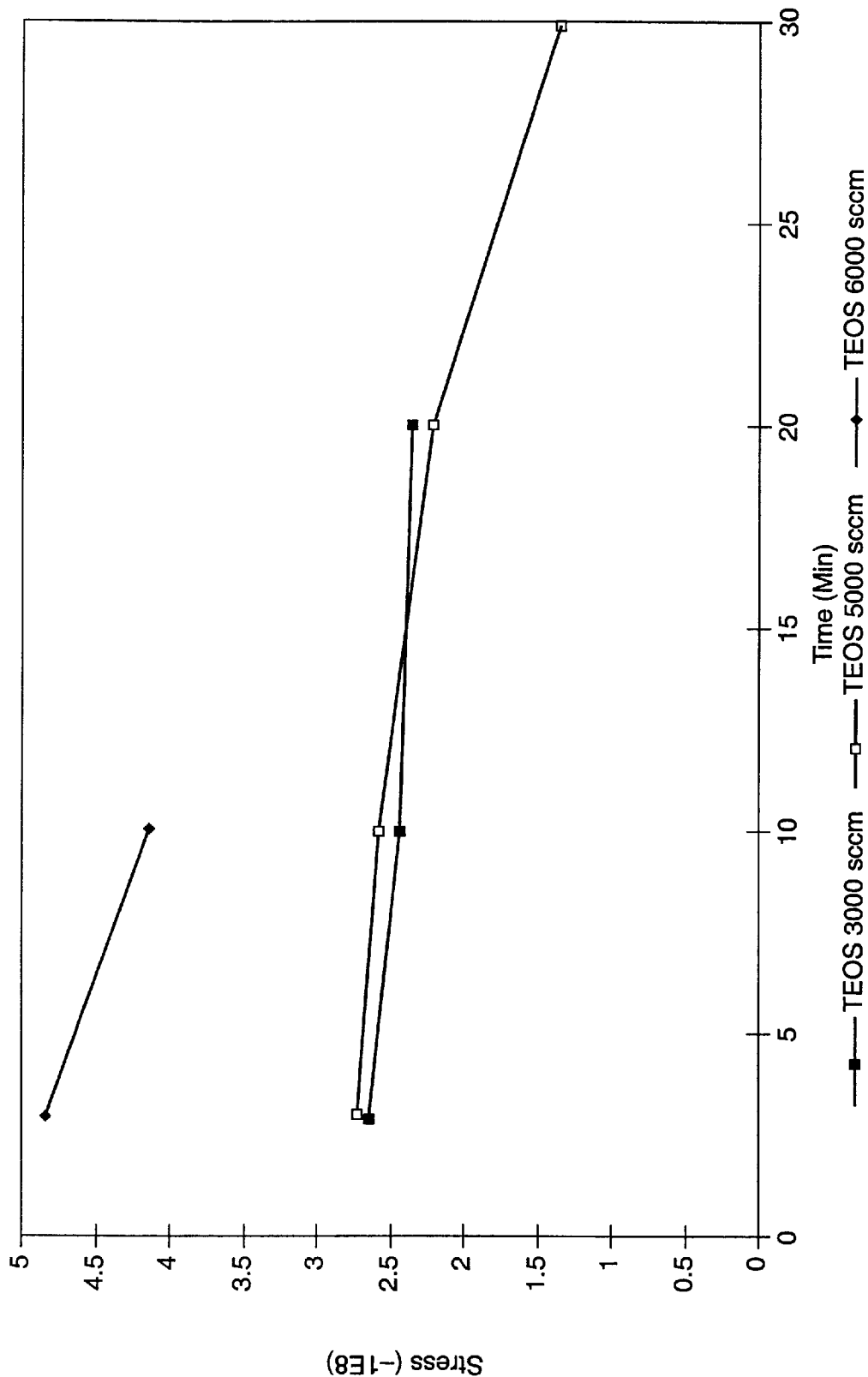
FIG. 4(b) shows how stress-time curves vary with TEOS flow rate.
Figure 4C:
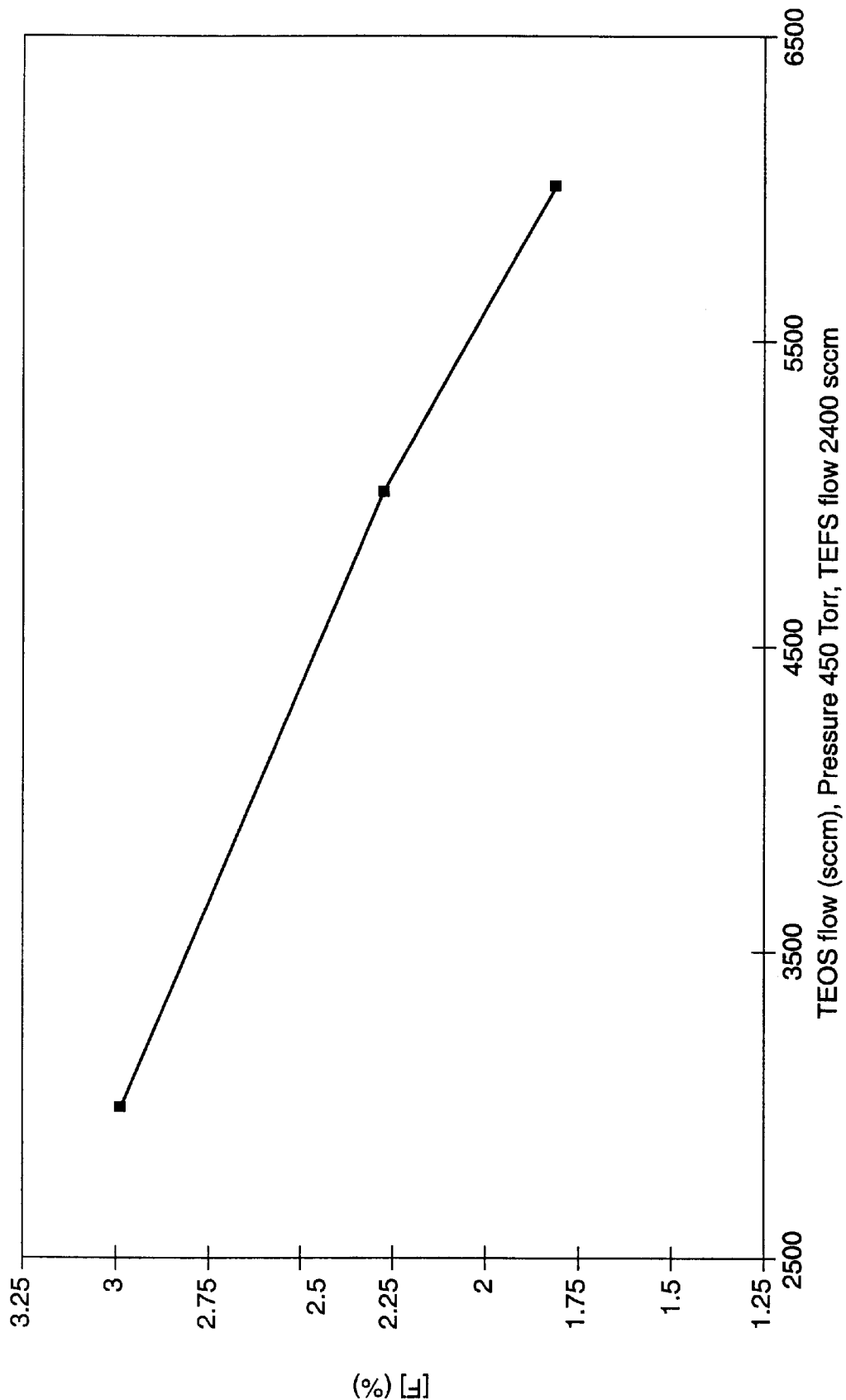
FIG. 4(c) is a graph of F concentration as a function of TEOS flow rate.

FIGS. 4(a)–4(c) are graphs illustrating the effects on the FSG films by varying TEOS flow rates. The effects of varying flow rates for the TEOS were investigated by depositing capped FSG films using the primary recipe having TEOS at a flow rate of 5000 sccm, and films using the primary recipe but with varying TEOS flow rates of 3000 and 6000 sccm. FIG. 4(a) is a graph illustrating deposition rate as a function of TEOS flow. No film was deposited when the TEOS flow was set to 1000 sccm, and the deposition rate increased as TEOS flow increased, as seen in FIG. 4(a). FIG. 4(b) illustrates stress-time curves of films deposited at different TEOS flow rates, and shows that the stress of each of the three films changed with time. As seen in FIG. 4(b), FSG films were formed that had low compressive stress ranging between about as low as $-1.5 \times 10^8$ to $-2.7 \times 10^8$ dynes/cm$^2$. As discussed earlier, it is desirable to produce a film having stress of less than $-5 \times 10^8$ dynes/cm$^2$, and preferably less than $-4 \times 10^8$ dynes/cm$^2$. As seen in FIG. 4(c), the F concentration in the films decreased as the TEOS flow increased. The data in FIGS. 4(a)–4(c) suggests that the deposition rate decreases as the F concentration increases.

Figure 5A:
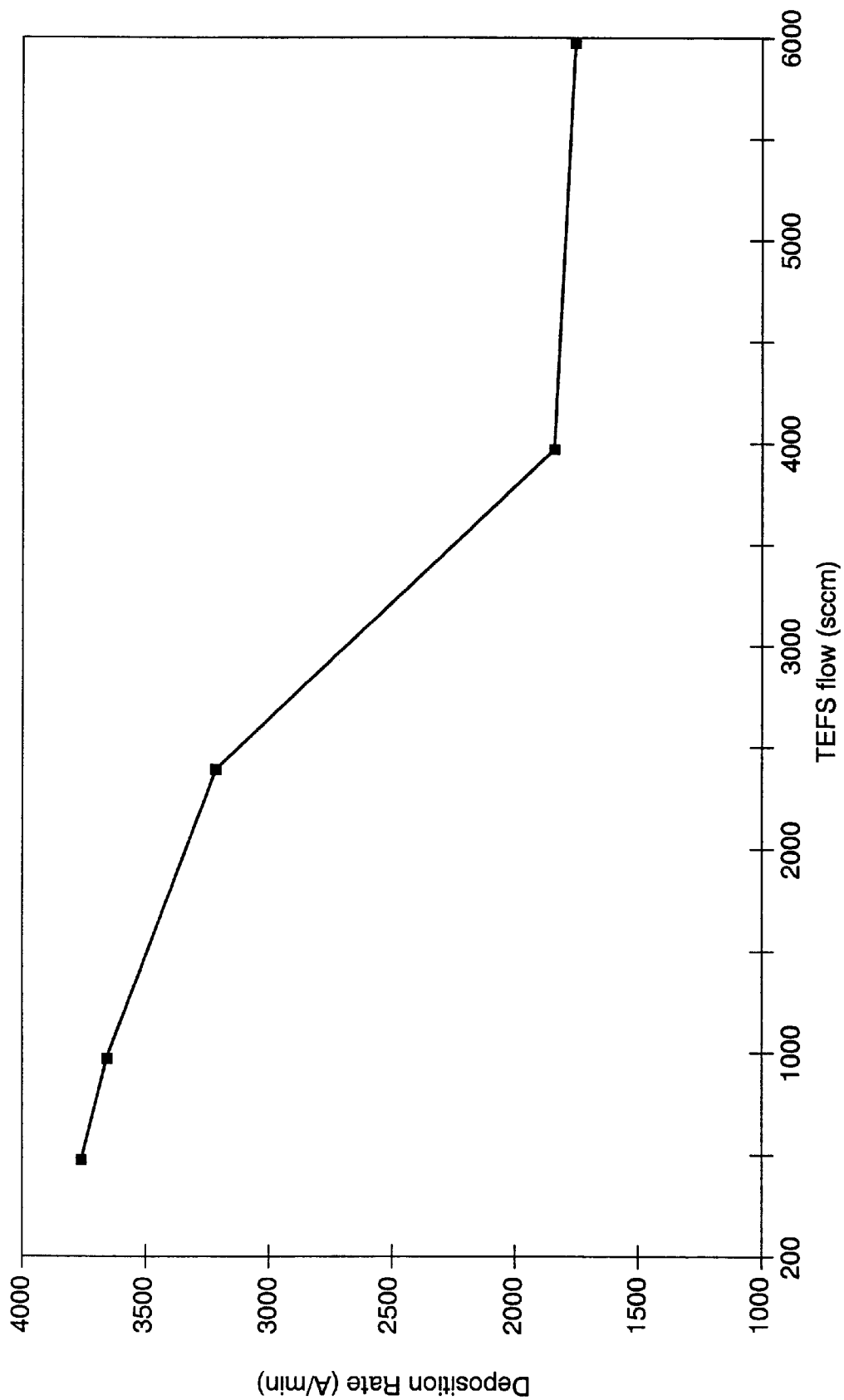
FIG. 5(a) is a graph showing the relation between deposition rate and triethoxyfluorosilane (TEFS) flow rate.
Figure 5B:
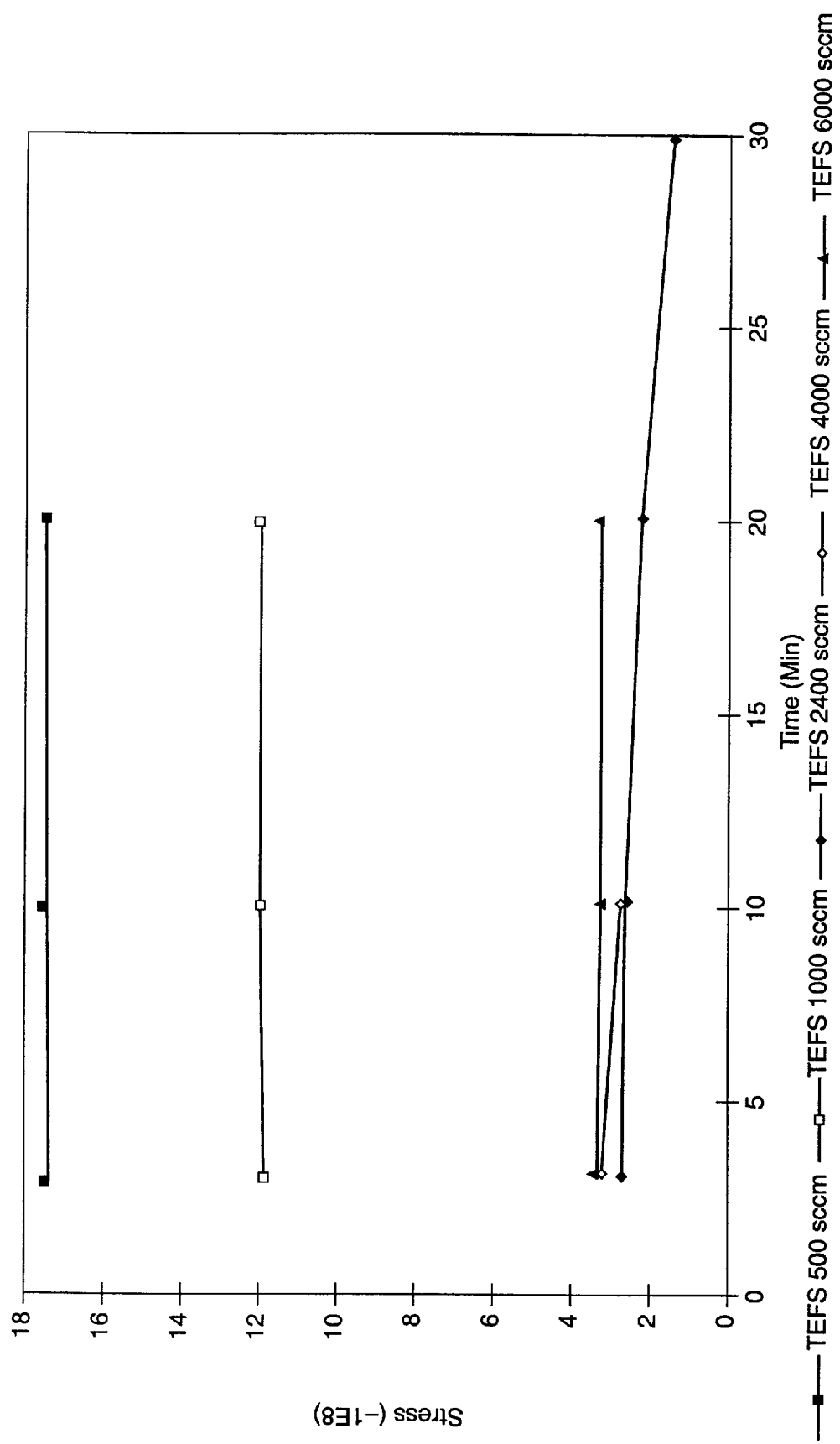
FIG. 5(b) shows how stress-time curves vary with TEFS flow rate.
Figure 5C:
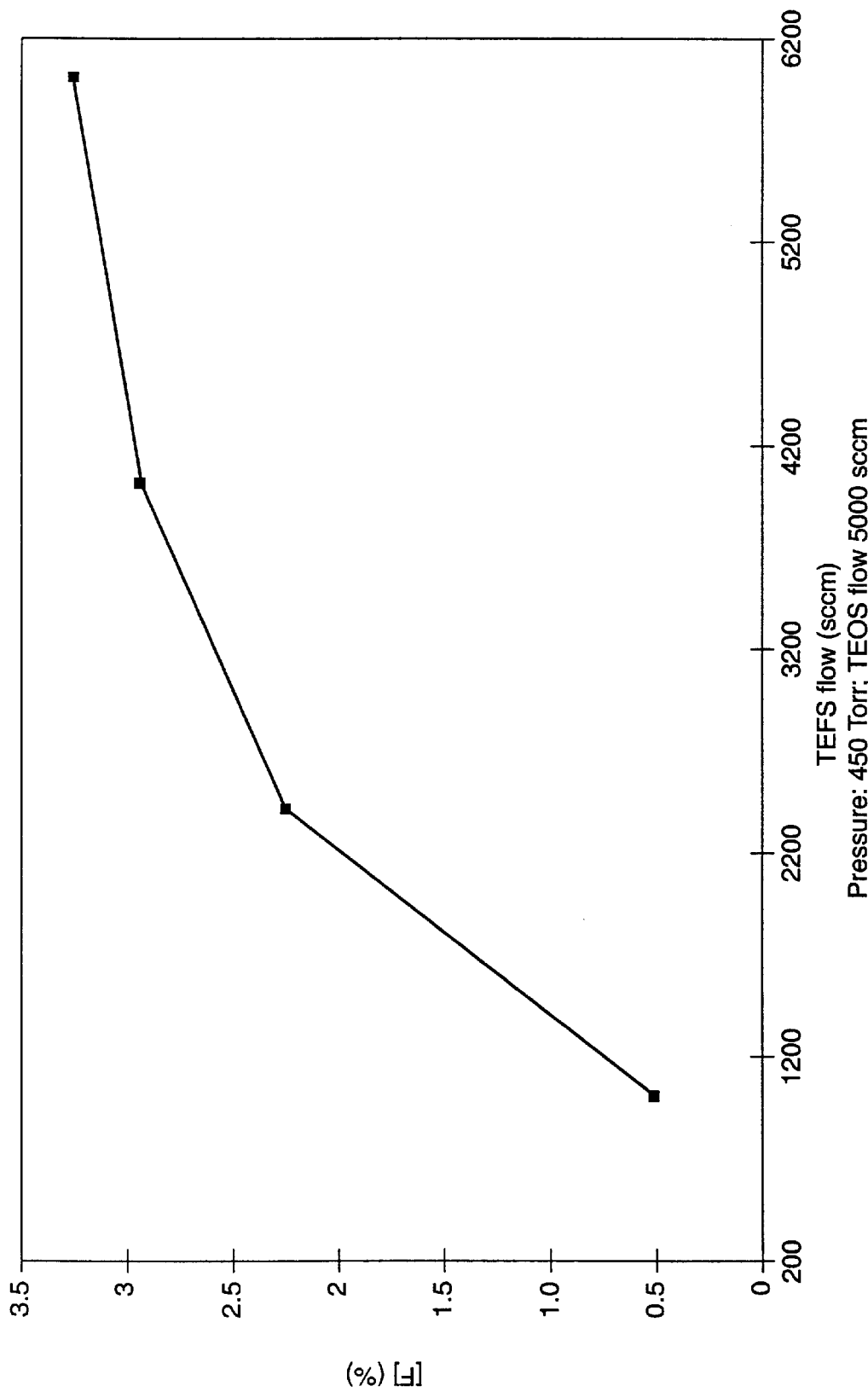
FIG. 5(c) shows how F concentration varies with TEFS flow rate.

FIGS. 5(a)–5(c) are graphs illustrating the effect on the FSG film by varying the TEFS flow rate. The effect of varying the TEFS flow rate was studied by depositing capped FSG films using the primary recipe having TEFS flow rate of 2400 sccm, and films using the primary recipe but with varying TEFS flow rates of 500, 1000, 4000, and 6000 sccm. As seen in FIG. 5(a) which shows the relation between deposition rate and TEFS flow rate, the deposition rate had the highest value (about 3800 Å/min) at 500 sccm TEFS flow, and decreased as the TEFS flow increased. FIG. 5(b) illustrates stress-time curves for films deposited at different TEFS flow rates. The stress in the films deposited at lower TEFS flow (about $-1.73 \times 10^9$ dynes/cm$^2$ at 500 sccm, about $-1.2 \times 10^9$ dynes/cm$^2$ at 1000 sccm, and about $-3.5 \times 10^9$ dynes/cm$^2$ at 2400 sccm) did not appear to change with time. The F concentration is shown as a function of TEFS flow in FIG. 5(c). No S—F bonds were detected by FTIR spectroscopy in the film deposited at 500 sccm TEFS flow. As FIG. 5(c) shows, F concentration increased as the TEFS flow increased.

Figure 6A:
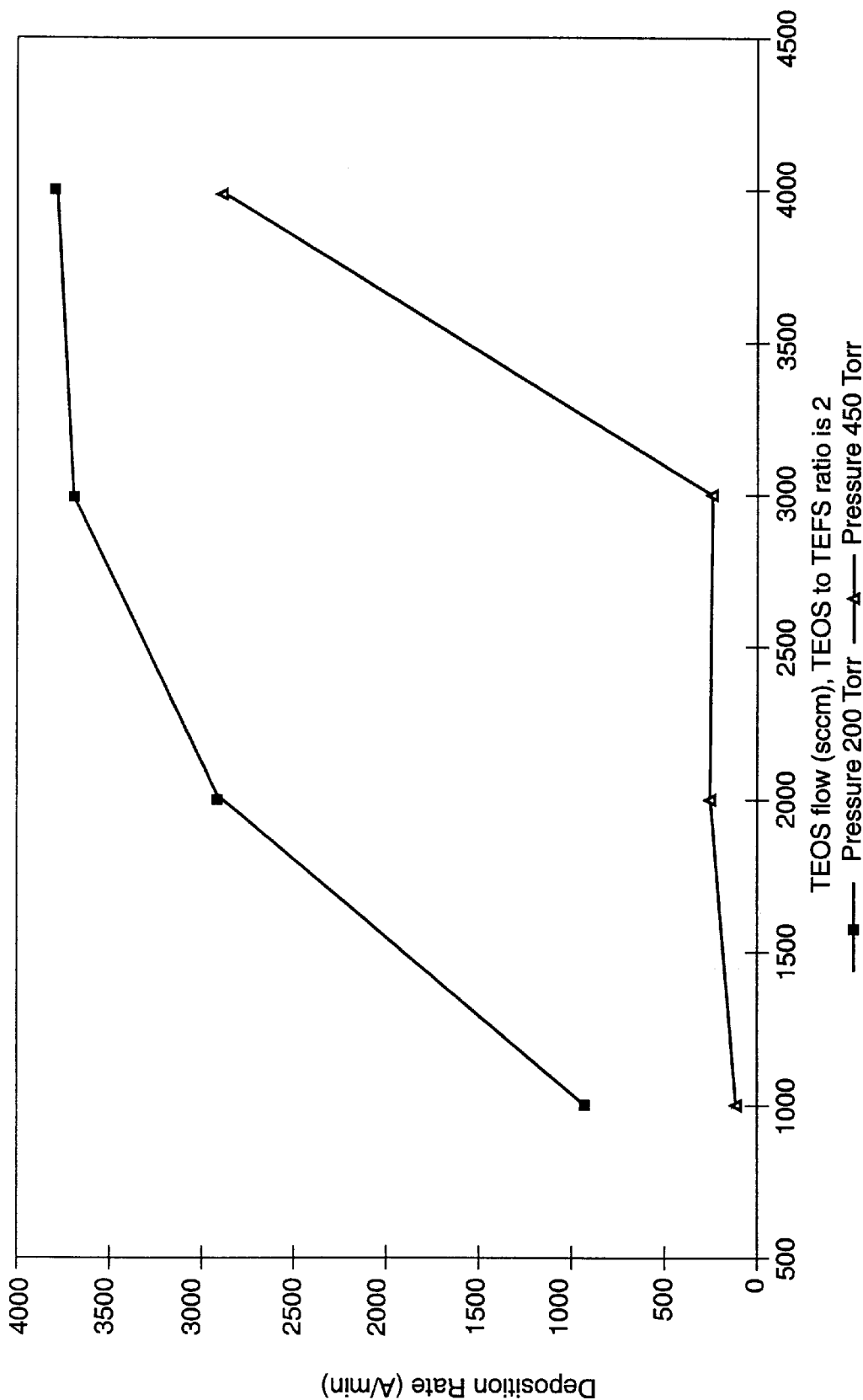
FIG. 6(a) shows dependence of deposition rate on TEOS flow rate at a fixed TEOS:TEFS ratio.
Figure 6B:
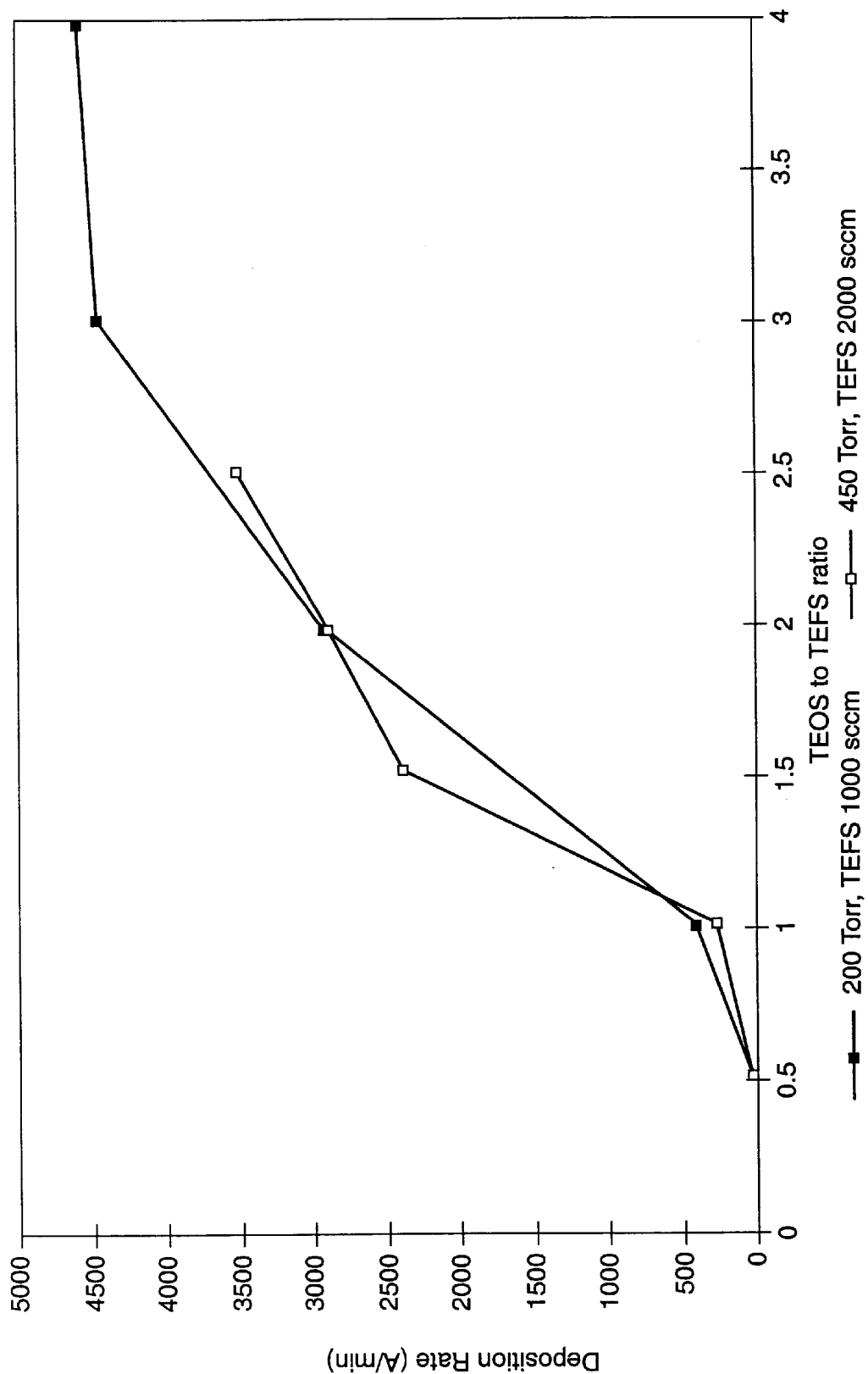
FIG. 6(b) shows dependence of deposition rate on TEOS:TEFS ratio.

Accordingly, it was seen that more stable films may be obtained at lower pressures. To compare films deposited using the primary recipe at different pressures of 200 and 450 torr, experiments with fixed TEOS to TEFS ratio (TEOS:TEFS ratio) and different TEOS flow were conducted to study deposition rates in relation to TEOS flow, as seen in FIG. 6(a). FIG. 6(a) shows that deposition rates at both 200 and 450 torr increased with increasing TEOS flow rates, for a TEOS:TEFS flow ratio that was kept constant at 2:1. It was also seen that the 450 torr process had lower deposition rates than the 200 torr process. Also, experiments with different TEOS:TEFS flow ratios and fixed TEFS flows (1000 sccm at 200 torr, and 2000 sccm at 450 torr) were conducted to study deposition rates in relation to TEFS flow, as shown in FIG. 6(b). FIG. 6(b) illustrates that higher TEOS:TEFS ratios resulted in higher deposition rates. Also, the deposition rate for the films deposited with 1000 sccm TEFS flow at 200 torr and for the films deposited with 2000 sccm TEFS flow at 450 torr overlapped to some extent, indicating that a higher TEFS flow rate may compensate for reduced deposition rates at higher pressures.

From the above, it is seen that the present invention provides a thermal SACVD deposited halogen-doped $O_3$/TEOS film (e.g., an $O_3$/TEOS film where the halogen is fluorine, in specific embodiments) which exhibits low compressive stress. Such films are thus highly suitable for use in IMD layers.

It is to be understood that the above description is intended to be illustrative and not restrictive. Many embodiments will be apparent to those of skill in the art upon reviewing the above description. By way of example, the inventions herein have been illustrated primarily with regard to the process recipes above. However, the bulk of a halogen-doped silicon oxide layer may be formed using any of several different processes. The process recipes of FSG films using TEFS as a fluorine source set forth above are intended as examples and should not be construed as limiting. Other possible recipes may use reactions of FASI 2, ozone and TEOS; or FASI 4, oxygen and TEOS; or TEFS and ozone; or $SiF_4$ and ozone; or $SiF_4$, TEOS and ozone; or TEFS, $SiF_4$ and ozone. Similar films may be deposited at a sub-atmospheric pressure from a reaction mixture of, for example, ozone, TEOS and a reagent from the class of haloorganosilanes of the formula $SiX_nR_{4-n}$ where n is an integer in the range of 1–3, X is a halogen, and each R is either a hydrogen or an alkoxy group with the proviso that at least one R is an alkoxy group as described in U.S. application Ser. No. 08/344,283 mentioned above. By way of further example, while the illustrated embodiments concerned a process using TEOS as a source of silicon and ozone as a source of oxygen, it is possible to use other silicon sources such as silane, other oxygen sources such as nitrous oxide ($N_2O$), carbon monoxide (CO) or others, or other dopant sources, depending on the particular application. The present invention is also applicable to silicon oxide films doped with members of the halogen family other than fluorine. Specifically the invention may be applicable to silicon oxide films doped with chlorine or bromine. The exemplary process may be performed in the reactor 10. Of course, those of ordinary skill in the art would understand that other process recipes and other types of reaction chambers may also be used to deposit the bulk FSG films, while remaining within the scope of the claims of the present invention. Additionally, variations of the reactor chamber, such as variations in pedestal design, lamp design, RF power frequencies, location of RF power connections and others are possible. For example, the wafer could be supported and heated by a resistively-heated pedestal. The scope of the invention should, therefore, be determined not with reference to the above description, but should instead be determined with reference to the appended claims, along with the full scope of equivalents to which such claims are entitled.

What is claimed is:

1. A process for depositing an insulating layer on a substrate in a chamber, said process comprising the steps of:

flowing a process gas comprising silicon, oxygen, and halogen atoms into the chamber to deposit a halogen-doped silicon oxide film on the substrate by thermal chemical vapor deposition, wherein said halogen-doped silicon oxide film has a compressive stress of less than about $-5 \times 10^8$ dynes/cm$^2$; and setting and maintaining pressure within the chamber at a pressure between about 60–650 torr during deposition of said halogen-doped silicon oxide film.

2. The process of claim 1 wherein said pressure is between about 70–600 torr.

3. The process of claim 2 wherein said pressure ranges from about 200 to about 450 torr.

4. The process of claim 1 wherein said halogen-doped silicon oxide film comprises a fluorinated silicon glass (FSG) film.

5. The process of claim 4 wherein said FSG film is formed using a fluorine source comprising TEFS.

6. The process of claim 5 wherein said FSG film is formed from a reaction of TEFS and $O_3$.

7. The process of claim 5 wherein said FSG film is formed from a reaction of TEOS and $O_3$.

8. The process of claim 7 wherein the ratio of TEOS to TEFS is about 2:1.

9. The process of claim 7 wherein the flow rate of TEOS with carrier gas is about 3000–5000 sccm, the flow rate of TEFS with carrier gas is about 1000–4000 sccm, and said pressure is about 450 torr.

10. The process of claim 7 wherein said FSG film has a compressive stress of less than about $-2 \times 10^8$ dynes/cm$^2$.

11. The process of claim 1 wherein said halogen-doped silicon oxide film is formed at a temperature of between about 200–500° C.

12. The process of claim 1 wherein said halogen-doped silicon oxide film is formed at a temperature of about 400° C.

13. The process of claim 1 wherein said halogen-doped silicon oxide film is deposited at a deposition rate of at least about 3000 Å/minute.

* * * * *